United States Patent [19]

Bristol

[11] Patent Number: 4,686,523
[45] Date of Patent: Aug. 11, 1987

[54] CURSOR DISPLAY FOR OSCILLOSCOPES
[75] Inventor: L. Rodney Bristol, Tigard, Oreg.
[73] Assignee: Tektronix, Inc., Beaverton, Oreg.
[21] Appl. No.: 575,417
[22] Filed: Jan. 31, 1984
[51] Int. Cl.[4] ............................................. G09G 3/02
[52] U.S. Cl. .................................. 340/709; 340/721; 340/722
[58] Field of Search ............... 340/709, 734, 722, 743, 340/720, 732; 315/395; 324/88, 121 R

[56] References Cited

U.S. PATENT DOCUMENTS

| | | | |
|---|---|---|---|
| 2,858,475 | 10/1958 | Blake | 340/722 |
| 2,901,664 | 8/1959 | Firmenich | 340/734 |
| 3,527,031 | 5/1971 | Neil et al. | 340/734 |
| 3,648,270 | 3/1972 | Metz et al. | 340/722 |
| 4,295,135 | 10/1981 | Sukonick | 340/734 |
| 4,400,780 | 8/1983 | Nagao et al. | 340/734 |

Primary Examiner—Charles A. Ruehl
Assistant Examiner—Brian R. Tumm
Attorney, Agent, or Firm—John P. Dellett; George T. Noe

[57] ABSTRACT

A cursor generator for an oscilloscope presents a cursor line or lines in juxtaposition with waveforms on an oscilloscope display, wherein the cursor is formed of a plurality of discrete points or dots. The deflection signal for generating the cursor is preferably supplied from the oscilloscope's character generator, while the analog positioning voltages for the cursor are also used in sweep delay comparison portion of the oscilloscope for initiating the oscilloscope's delayed sweep.

4 Claims, 5 Drawing Figures

CURSOR DISPLAY FOR OSCILLOSCOPES

BACKGROUND OF THE INVENTION

The present invention relates to oscilloscopes and more particularly to oscilloscopes incorporating apparatus and employing a method for economically and accurately providing cursor displays which are easily distinguishable from the remainder of the oscilloscope presentation.

An oscilloscope can be utilized for graphically portraying one or a number of analog signal waveforms and for measuring various electrical characteristics thereof such as amplitude, frequency, pulse-width, etc. Thus, an oscillope can be employed to compare the displayed waveform with a grid or graticule located adjacent the instrument's cathode-ray-tube screen. However, this type of measurement is apt to be approximate and depends upon operator judgment as well as upon accurate calibration of the oscilloscope.

Another approach is to employ an operator controllable representation or cursor which is movable on the screen with respect to the waveform being measured. The operator merely positions the cursor representation in coincidence with the waveform dimension of interest, and the instrument provides an analog or digital readout of cursor position which should be substantially independent of operator judgment, instrument setting, etc. A cursor generator can be utilized to provide a pair of bright spots or dots superimposed on the waveform display. The voltage difference or time interval between the two cursor spots is measured and indicated directly on the cathode-ray-tube screen or on another indicator, for example, as disclosed in U.S. Pat. No. 3,881,133 to Frye. Alternatively, horizontal or vertical lines can be disposed in superimposed relationship with the signal waveforms as shown in Japanese patent publication Nos. 62070/77, 62071/77, and 62072/77.

The cursor lines of a conventional oscilloscope cursor display are solid lines or a combination of solid and broken lines. With a complex oscilloscope display, e.g. when two, three, four or more vertical channels are used, it is difficult to distinguish the cursor representation from the waveforms being measured. Also, a typical oscilloscope instrument is already complex, and it would be of advantage to provide a unique cursor representation in conjunction with circuitryalready in the instrument rather than by adding additional circuitry.

SUMMARY OF THE INVENTION

In accordance with the present invention in a particular embodiment thereof, an apparatus and method provides an adjustable cursor value representative of a cursor position on a cathode-ray-tube screen, and operates cathode-ray-tube deflection apparatus in accordance therewith to establish a cursor position in one dimension on the screen. The remaining orthogonal deflection means of the cathode-ray-tube is operated for deflecting the electron beam in the orthogonal direction and the electron beam of the cathode-ray-tube is caused to be effectively discontinuous whereby to provide a discontinuos cursor presentation, preferably comprised of a plurality of discrete points or dots. The cursor thus generated is easily distinguishable from the waveform displays on the cathode-ray-tube screen, thereby avoiding human error during placement of the cursor and during measurement procedures.

Furthermore, in accordance with a particular embodiment of the present invention, an adjustable cursor value is the same adjustable value provided for initiating the oscilloscope's delayed sweep. Also the electron beam deflection signal producing the cursor preferably comprises a stepped wave for generating discrete points making up a cursor line, and this stepped wave is desirably obtained in form of a dot matrix output of a character generator in respect to one axis of a matrix generation, wherein the same character generator is alternatively operated to present both the cursor and alphanumeric character readout on the screen of the oscilloscope.

It is accordingly an object of the present invention to provide an improved oscillocope device having circuitry for generating a cursor display which is easily distinguishable from the analog waveform display normally presented and viewed on the same instrument.

It is another object of the present invention to provide an improved oscilloscope device having cursor display means which employs circuitry in the oscilloscope device also used for other purposes.

It is another object of the present invention to provide an improved oscilloscope device supplying a cursor presentation which is accurate and which nevertheless adds insubstantially to the complexity and cost of the instrument.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

FIG. 1 is a block diagram of an oscilloscope according to the present invention, FIG. 2 is a block diagram of a character generator portion of the FIG. 1 oscilloscope, FIG. 2a illustrates a dot-matrix character provided by the FIG. 2 generator, FIG. 3 is a view of a first cathode-ray-tube presentation showing a first type of a cursor provided by the present invention, and FIG. 4 illustrates a cathode-ray-tube display showing a second type of cursor presentation provided according to the present invention.

DETAILED DESCRIPTION

Figure 1:
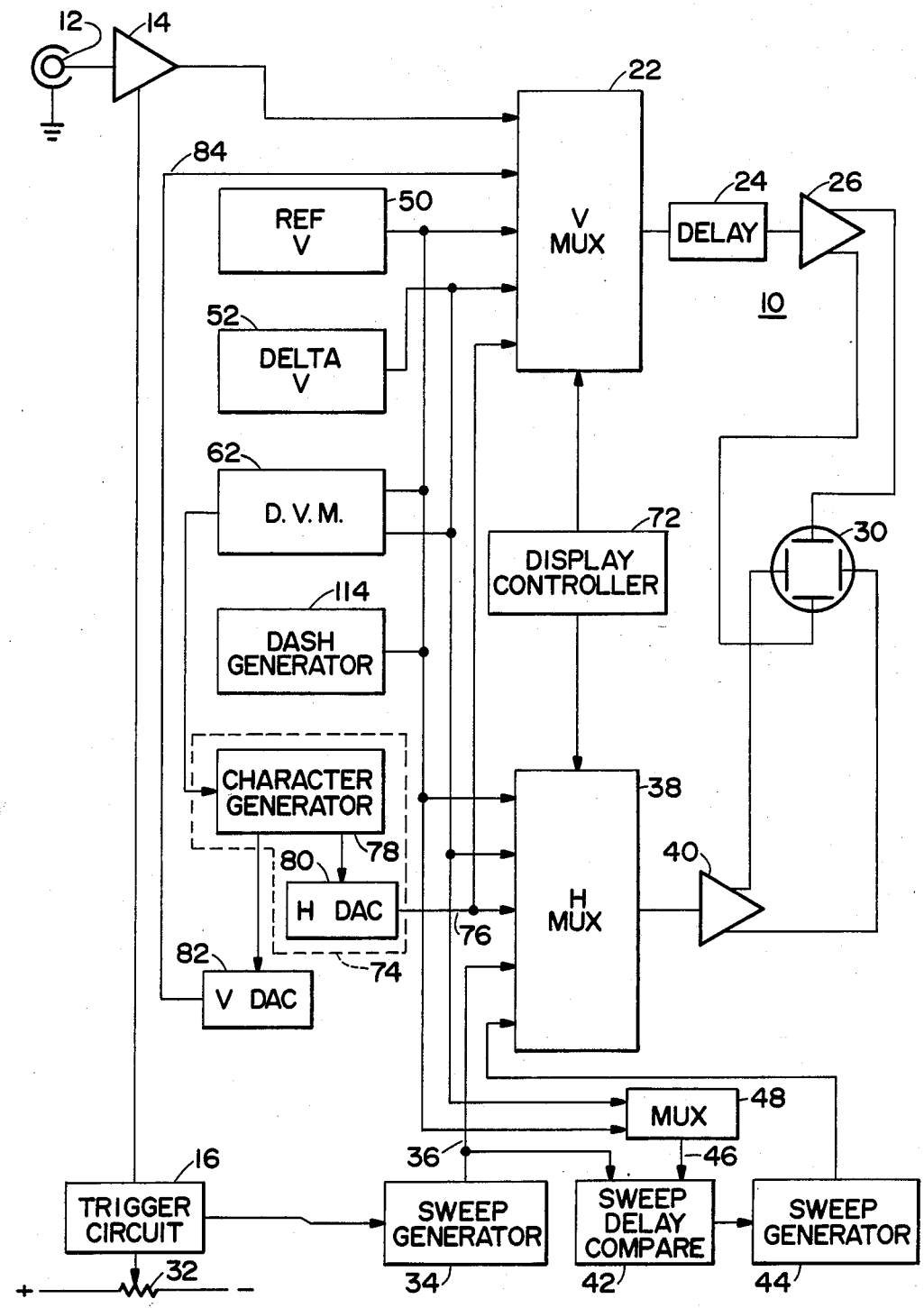

Referring to the drawings, and particularly to FIG. 1 illustrating a preferred embodiment of the present invention, an oscilloscope 10 is provided with an input terminal 12 adapted to receive an input signal which is amplified by amplifier 14. The output of amplifier 14 is supplied as one input to vertical multiplexer or switch 22 disposed in driving relation to delay means 24 the purpose of which is to insure proper triggering of the instrument before the input signal reaches the oscilloscope's cathode-ray-tube. The output of delay means 24 is applied to vertical output amplifier 26 which drives the vertical deflection plates of cathode-ray-tube 30.

A portion of the input signal obtained from amplifier 14 is used as an internal triggering signal and is applied to trigger circuit 16. The triggering signal from amplifier 14 is compared in trigger circuit 16 with a controllable trigger level from potentiometer 32 and provides a trigger pulse when the triggering signal crosses the selected level. The trigger pulse when the triggering signal crosses the selectedlevel. The trigger pulse from circuit 16 is applied to sweep generator 34 which generates a ramp waveform or time base sweep coupled as an input to horizontal multiplexer or switch 38. The output of the horizontal multiplexer is supplied to the horizontal deflection plates of cathode-ray-tube 30 by way of horizontal output amplifier 40. As will be understod by those skilled in the art, the ramp waveform from horizontal output amplifier 40 establishes the time base whereby the input signal waveform is displayed on the cathode-ray-tube.

The output of sweep generator 34 is also applied to a sweep delay comparator 42 driving a delayed sweep generator 44. The sweep delay comparator 42 compares the ramp output of sweep generator 34 with a voltage on lead 46 from delay reference multiplexer 48, and when the ramp from sweep generator 34 reaches the comparison voltage, operation of delayed sweep generator 44 is initiated. The output of sweep generator 44 is coupled as an alternatively selectable sweep input to horizontal multiplexer 38.

In accordance with the present invention, a pair of reference lines or cursors are respectively controlled by reference voltage source 50 and delta voltage source 52. The purpose of these cursors is the measurement of certain amplitude and time values associated with the waveforms displayed on the screen of cathode-ray-tube 30. Each of the voltage sources 50 and 52 may comprise a potentiometer, or may comprise a more sophisticated variable voltage source which in any case permits operator selection of the voltages provided. In accordance with the present invention, the cursors are presented as a series of dots or short dashes to distinguish the cursors from the input waveform or waveforms displayed on the screen of the cathode-ray-tube.

Figures 3, 4:
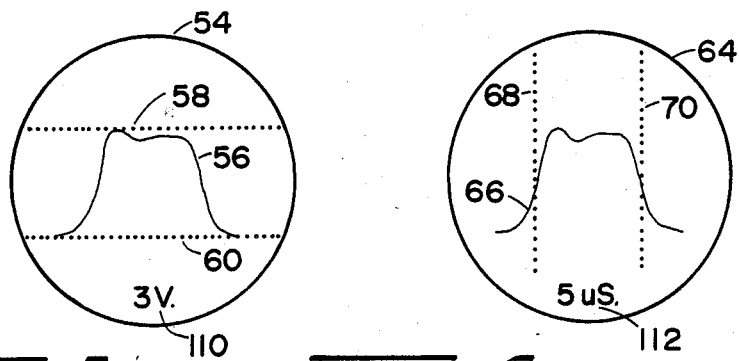

Referring briefly to FIG. 3, a cathode-ray-tube presentation is illustrated at 54 and includes an input waveform trace 56. Also illustrated is a first cursor 58 movable in vertical position in accordance with the reference voltage from source 50 in FIG. 1, and a second cursor 60 which is selectable in its vertical position by means of voltage source 52 in FIG. 1. Thus, the respective cursors may be moved into juxtaposition with waveform 56 as shown for the purpose of measuring the amplitude of the waveform. The difference between the voltages of sources 50 and 52 is conveniently measured employing digital voltmeter 62 in FIG. 1, with appropriate scale factors applied.

Referring briefly to FIG. 4, a second cathode-ray-tube presentation is illustrated at 64 including the display of a waveform 66. Also shown are cursors 68 and 70, suitably positioned in accordance with the voltages selected by voltage sources 50 and 52 in FIG. 1. In this instance, the voltage difference between the cursors 68 and 70 is again measured by digital voltmeter 62 in FIG. 1, but is proportional to time as represented by the time base sweep employed to generate display 64. Again, appropriate scale factors must be applied.

Returning to FIG. 1, vertical multiplexer 22 and horizontal multiplexer 38 "normally" select the output of amplifier 14 and the output of one of the aforementioned sweep generators to provide the waveform display illustrated at 56 and 66 in FIG. 3 and 4. However, at intervals the multiplexers 22 and 38 are suitably switched by display controller 72 so that vertical multiplexer 22 selects the output of voltage reference 50 while horizontal multiplexer 38 selects the output of cursor scanning device 74 via lead 76. The output of reference voltage source 50 is constant, and consequently a horizontal "line" 58 in FIG. 3 is produced at a constant vertical position. Cursor scanning device 74, instead of providing a scanning ramp waveform, supplies a stepped waveform or a series of discrete voltage steps, one after another, which causes the cathode-ray-tube's electron beam to step between discrete points as illustrated by the dots at 58 in FIG. 3.

At a subsequent time in the cycle, display controller 72 switches multiplexer 22 such that it passes the delta voltage from source 52, with the horizontal multiplexer 38 continuing to provide discrete voltage steps from cursor scanning device 74. The delta voltage 52 is normally selected to be different from the reference voltage, and, in a particular example produces a horizontal "line" depicted at 60 in FIG. 3. Again the horizontal sweep signal breaks up the line into a series of dots. The sequence of events is, of course, rapidly repeated such that cursors appear to be superimposed with respect to the waveform as illustrated in FIG. 3.

Alternatively, the controller 72 causes horizontal multiplexer 38 to switch between inputs from sources 50 and 52 while the vertical multiplexer selects the voltage steps from device 74. As a result, the display depicted in FIG. 4 is presented. Again, the controller rapidly cycles the multiplexer inputs between those presenting the signal input waveform, and those presenting the cursors.

Considering more particularly the cursor scanning signal generator 74, this device suitably employs a character generator 78 that forms a part of the same instrument and is used in portraying alpha-numeric characters on the screen of cathode-ray-tube 30 during an information "readout" mode. The character generator drives horizontal DAC (digital to analog converter) 80 which provides the aforementioned output on lead 76, and also drives vertical DAC 82 connected in input relation to vertical multiplexer 22 by means of lead 84. During information readout, vertical multiplexer 22 and horizontal multiplexer 38 respectively select the lead 84 and lead 76 inputs for short periods, while the character generator 78 is operated to supply dot matrix character representations via the vertical and horizontal DACs.

Then, during cursor generation, only the output of horizontal DAC 80 is supplied to either horizontal multiplexer 38 or vertical multiplexer 22, and the reference voltage source 50 or the delta voltage source 52 supplies the input to the remaining multiplexer as previously mentioned. The cursors comprise rows of dots or series of rows of dots produced from the character generator.

Figure 2:
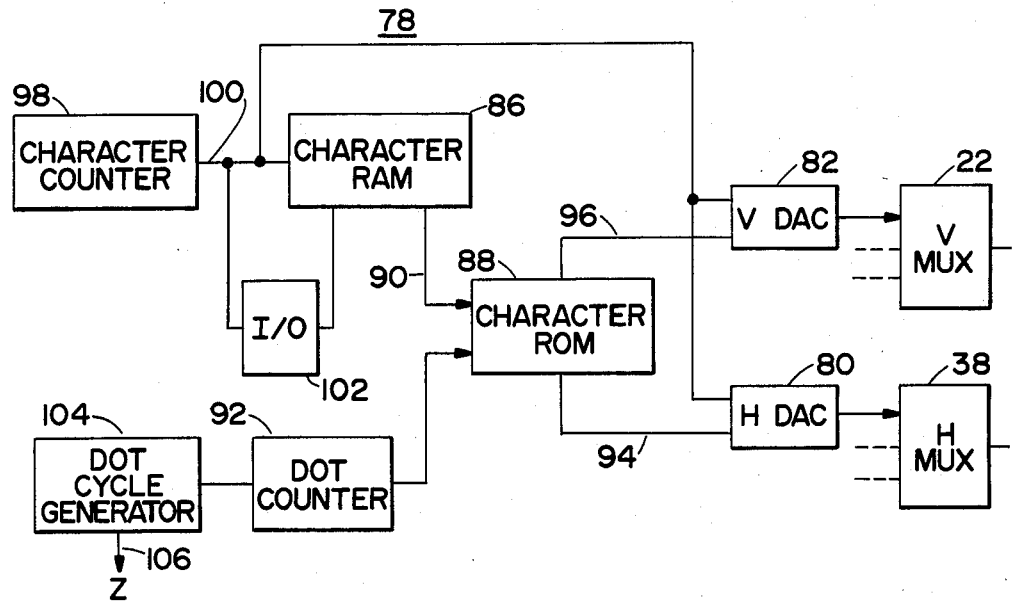
Figure 2A:

Although various forms of character generators may be employed, a particular character generator is illustrated in FIG. 2 by way of example. Referring to FIG. 2, the character generator 78 suitable comprises a character RAM (random access memory) 86 which stores the identification of various characters at the addresses in the RAM corresponding to locations on the screen of the cathode-ray-tube, and a character ROM (read only memory) 88 which stores the dot locations for various individual characters. Thus, if the output 90 from character RAM 86 addresses the numeral "two" in character ROM 88, character ROM 88 will supply a series of X axis and Y axis location outputs for a sequence of dots corresponding to the numeral "two". The representation on the screen will be as illustrated in FIG. 2a. The X axis location of each dot is provided on X axis output 94 to horizontal DAC 80, while the Y axis location of each dot is provided as indicated at 96 to vertical DAC 82.

The character RAM is sequenced between separate characters by character counter 98 supplying an addressing output 100. The same address output is also applied to horizontal DAC 80 and vertical DAC 82 so that the character is written at the desired location on the screen of the cathode-ray-tube.

The dot counter 92 is caused to count and consecutively address "dots" in character ROM 88 upon receiving an input from dot cycle generator 104 employed to initiate the writing of each dot. The dot counter 92 sequences the character ROM 88 through a block of dot addresses for each character as selected by character RAM 90. Dot cycle generator 104 cycles each time a dot is written, and substantially simultaneously provides a Z-axis output 106 to cathode-ray-tube 30 for turning on the electron beam of the cathode-ray-tube for the presentation of each dot.

For the portrayal of alpha-numeric characters on the screen of the cathode-ray-tube, the horizontal DAC 80 and the vertical DAC 82 supply the successive analog voltages via horizontal multiplexer 38 and vertical multiplexer 22 for writing respective dots on the cathode-ray-tube screen.

Initial storage of identifications of characters to be written is made via I/O (input/output) circuit 102 which addresses the character RAM 86 and loads the identifications of the characters at addresses in the RAM corresponding to their desired locations on the cathode-ray-tube screen.

During cursor operation, as selected by multiplexers 22 and 38, only horizontal DAC 80 is used, and output 90 from character RAM 96 suitably selects a "character" comprising only a row of dots in ROM 88. A more extended row is suitably identified by a sequence of addresses in character RAM 86 corresponding to the segments of the cursor and are sequenced by character counter 98. In effect, the character generator produces a sequence of dotted "hyphens" which are written end to end on the screen of the cathode-ray-tube to produce a cursor.

It will be seen a stepped wave output is produced from horizontal DAC 80 for positioning the successive dots at successive locations, and as a matter of convenience the horizontal DAC is used for this purpose whether the cursor is disposed in a horizontal direction or a vertical direction on the screen of the cathode-ray-tube. Although the character generator can be used for the generation of this stepped wave in the above-described manner and is greatly preferred because of a multiple use of the character generator, it is also possible to generate a stepped wave by a simpler stepped wave generator.

Returning to FIG. 1, the difference between the reference voltage from source 50 and the delta voltage from source 52 indicative of the spacing between the cursor lines is suitably measured by digital voltmeter 62 as hereinbefore mentioned. The output of digital voltmeter 62 may be applied to the character generator 78 in order to provide a numerical readout of the cursor spacing, for example as illustrated at 110 in FIG. 3. For this purpose, the output of the digital voltmeter is applied to input/output circuitry 102 in FIG. 2 for addressing the character generator for supplying a numerical readout corresponding to the measured voltage. Of course, the digital voltmeter can provide a direct reading output of its own if so desired.

The time period represented between the cursor lines in FIG. 4 may also be read out as indicated at 112 in FIG. 4 with a digital voltmeter capable of scale factor conversion and receiving an additional input from the sweep generator (34 or 44) providing the time base sweep rate used in portraying the measured waveform in a manner understood by those skilled in the art.

The same variable voltages, from sources 50 and 52, are applied to delay reference multiplexer or switch 48 which is employed to choose therebetween for establishing a reference to initiate the delayed sweep. These voltages or the difference therebetween can be measured employing digital voltmeter 62.

Although the cursor presentation formed of individual dots is preferred, the cursor can alternatively constructed as a series of separated line segments, for example be continuously deflecting the electron beam in the cursor direction by device 74 and simultaneously modulating the Z-axis of the electron beam. Also, the present system can be utilized to provide a short dash cursor presentation by superimposing low-amplitude signals upon the output of horizontal DAC 80 utilizing a dash generator 114. This dash generator suitably generates a series of low-amplitude ramp signals selectably added to the output voltage from DAC 80 during the presentation of a cursor element whereby the element is elongated into a dash. Furthermore, different cursors may be presented comprising distinctive dot patterns.

Reviewing operation of the FIG. 1 circuit, the vertical multiplexer 22 and horizontal multiplexer 38 are "normally" operated, e.g. during a first time period, to pass the vertical input signal from amplifier 14, and the horizontal sweep signal from sweep generator 34 or sweep generator 44. Periodically, or between waveform presentations, the multiplexers are controlled by display controller 72 to present additional information. Thus, during a second alternative time period, character generator 78 operating horizontal DAC 80 and vertical DAC 82 respectively may supply ouputs via the multiplexers for writing dot matrix characters at specified locations on the screen of the cathode-ray-tube. During a third time period, a pair of cursors can be written on the cathode-ray-tube screen corresponding in position to voltages selected by source 50 and source 52. At this time these voltages are alternately coupled through vertical multiplexer 22 to the vertical output system while horizontal multiplexer 38 selects a dot-row or stepped wave output produced by character generator 78 by way of horizontal DAC 80. Therefore a presentation as depicted in FIG. 3 is provided. Instead of selecting voltage source 50 and voltage source 52 with vertical multiplexer 22, these voltage sources may be sequentially selected by horizontal multiplexer 38, while vertical multiplexer 22 selects the output of horizontal DAC 80. According to this mode of operation, the presentation as illustrated in FIG. 4 is secured. Of course, the entire sequence of events is rapidly repeated so that waveforms, characters and cursors appear to be presented simultaneously.

For purposes of accurate calibration of modes of delta time measurement, the horizontal multiplexer 38 is arranged such that the gain through the path carrying the horizontal input signal (from source 74) is equal to the gain of the path carrying the cursor voltages from sources 50 and 52, and by constructing the delay references multiplexer 48 and the sweep delay comparator 42 for equal gain for the horizontal or sweep input signal and the cursor voltages.

While I have shown and described a preferred embodiment of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. An apparatus for providing a cursor presentation on a cathode-ray-tube screen in conjunction with waveform information displayed through application of deflection controlling inputs to first and second orthogonally related deflection means of said cathode-ray-tube, said apparatus comprising:

means for providing an adjustable cursor value, a first multiplexer connected in driving relation to said first deflection means, said first multiplexer receiving a signal input representing a waveform to be displayed, a second multiplexer connected in driving relation to said second deflection means, said second multiplexer receiving time base information for displaying said waveform, and means for supplying said cursor value via one of said multiplexers to its corresponding deflection means and means for simultaneously supplying a stepped input via the other multiplexer to its corresponding deflection means, thereby generating a discontinuous cursor line in viewable relation to said waveform.

2. The apparatus according to claim 1 further including means for providing a delta cursor value which is adjustable with respect to said first mentioned adjustable cursor value, and means for also supplying said delta cursor value to said one of said multiplexers for presentation while supplying said stepped input to said other multiplexer for generating a discontinuous delta cursor line in viewable relation to said waveform.

3. The apparatus according to claim 1 wherein said means for supplying a stepped input to the other multiplexer comprises a character generator providing a sequence of dot producing outputs for establishing said cursor line in the direction of deflection of said second deflection means, said character generator being coupled to said first and second multiplexers for presentation of characters on said screen.

4. The apparatus according to claim 1 including first sweep generator means for generating said time base sweep information, second sweep generator means for generating delayed time base sweep information coupled as an alternative input to said second multiplexer, and a sweep delay comparator responsive to the output of said first sweep generator means and responsive to said cursor value for initiating operation of said second sweep generator means for generating said delayed time base sweep information when said output of said first sweep generator means reaches said cursor value.

* * * * *